United States Patent

[11] 3,614,667

[72] Inventor Martin W. Fletcher
Palo Alto, Calif.
[21] Appl. No. 353,082
[22] Filed Mar. 19, 1964
[45] Patented Oct. 19, 1971
[73] Assignee Itek Corporation
Lexington, Mass.

[54] SWITCHABLE AND MODULATORY CRYSTAL OSCILLATOR
6 Claims, 1 Drawing Fig.

[52] U.S. Cl. .......... 332/26, 331/116 R, 331/161, 332/19 T
[51] Int. Cl. .......... H03c 3/28
[50] Field of Search .......... 332/14, 26, 10, 9 T, 11, 11 D; 331/49, 56, 116, 159, 161, 59, 73, 182, 183, 173

[56] References Cited

UNITED STATES PATENTS

| | | | |
|---|---|---|---|
| 2,817,061 | 12/1957 | Bowers | 332/11 D |
| 2,925,563 | 2/1960 | Firestone | 332/26 |
| 3,020,421 | 2/1962 | Craiglow | 331/161 X |
| 3,040,272 | 6/1962 | Hukee | 331/159 X |
| 3,077,574 | 6/1963 | Marks | 331/116 X |
| 3,118,116 | 1/1964 | Freedman | 332/11 X |
| 2,498,689 | 2/1950 | Levy | 331/59 |
| 3,167,730 | 1/1965 | Anderson | 331/179 |
| 3,179,902 | 4/1965 | Bernfield | 331/59 |

*Primary Examiner*—Rodney D. Bennett, Jr.
*Assistant Examiner*—Daniel C. Kaufman
*Attorneys*—Lester S. Grodberg, Harvey G. Lowhurst, Homer O'Blair and Robert L. Nathans CLAIM: 6. Apparatus for pulse modulating a crystal oscillator comprising:

a transistor amplifier;

a plurality of parallel feedback paths connected to said amplifier, each said feedback path including a crystal having a different resonant frequency;

switch means associated with each of said feedback paths, each said switch means normally open to disconnect each of said feedback paths from said amplifier;

means for applying a pulse modulating signal to at least the base electrode of one transistor forming one stage of said amplifier to render it conductive;

gain control means connected to the stage of said amplifier to which said pulse-modulating signal is applied for providing maximum gain in said amplifier when said amplifier is first rendered conductive and for decreasing this gain thereafter; and means for applying successive switching signals to said switch means, one at a time, to thereby connect different ones of said feedback paths to said amplifier, whereby an output signal of the frequency of the crystal associated with the connected feedback path is generated.

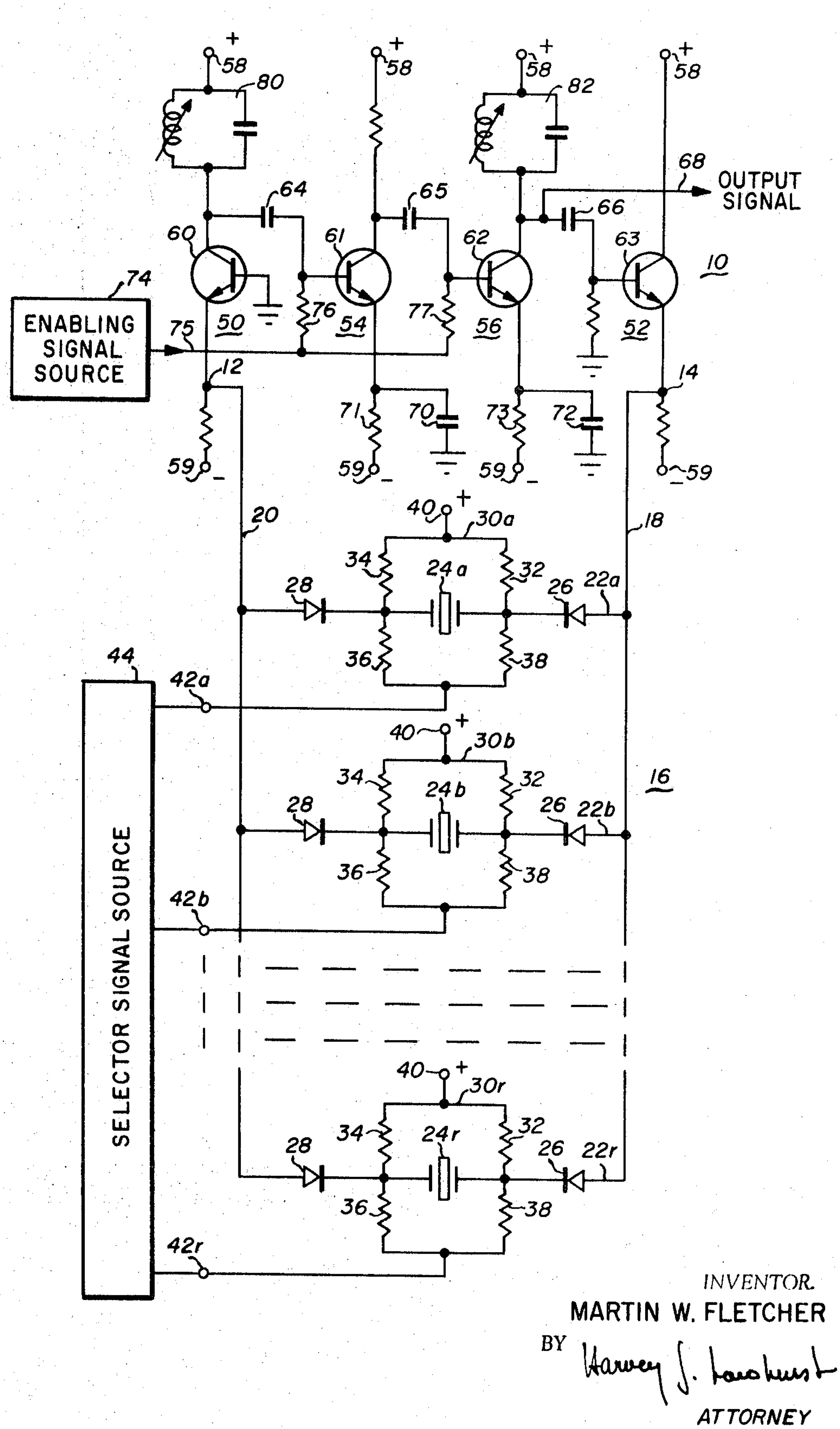
INVENTOR.
MARTIN W. FLETCHER
BY Harvey J. Lauchhurst
ATTORNEY

SWITCHABLE AND MODULATORY CRYSTAL OSCILLATOR

This invention relates to crystal-controlled oscillators and more particularly to a signal source whose output frequency can be very quickly switched from any one to any other one of a plurality of preselected discrete frequencies, or which can be very quickly turned on or off, or both.

In some communication applications, and particularly in connection with counter measures and jamming, it has been found desirable to provide a signal generator capable of supplying, in some predetermined sequence, signals of different frequencies. One of the requirements for such an oscillator is that the frequency of each signal has a very high frequency stability and that switching from one to another frequency be accomplished at a very fast switching rate. Another requirement for such an oscillator is that the signal of any selected frequency can be pulsed or otherwise suitably modulated and that the signal can be turned on or turned off very fast with very short rise and fall times.

Oscillators known heretofore have been found wanting in meeting all these requirements. Oscillators which exhibit great frequency stability usually have long time constants making fast switching impossible, or else they exhibited fast switching rates with a corresponding sacrifice of frequency stability. And in instances where oscillators fulfilled both the frequency stability requirement, and the fast-switching requirement, as for example with oscillators whose output signal is controlled with logic gates, the leakage of the nonselected signals prevented the oscillator from providing a "clean" output signal i.e. the output signal usually includes a small portion of the nonselected frequencies.

To achieve the desired frequency stability of the output signal it has been found necessary to utilize piezoelectric quartz crystals. As is well known a quartz crystal located in the oscillator circuit feedback normally controls the frequency of the oscillator. However, crystal-controlled oscillators have a long time constant often of the order of magnitude of several milliseconds. Accordingly, either switching or pulse modulating such oscillators is slow.

Accordingly, it is one of the objects of this invention to provide an oscillator which may be switched from one to another frequency in a time period less than 50 microseconds.

It is another object of this invention to provide an oscillator which can be switched from one to another signal frequency and in which each signal has a frequency stability characteristic of crystal oscillators.

It is a further object of this invention to provide an oscillator capable of being switched from one to any other of a number of preselected signal frequencies and which may be modulated to provide a pulsed output signal whose rise and fall time is less than 50 microseconds.

It is still another object of this invention to provide a crystal oscillator switchable between a number of different frequencies with a switching rate higher than has been possible heretofore.

It is a still further object of this invention to provide a switchable crystal oscillator which can be very quickly changed from one frequency to another frequency by changing the potential at selected points of the circuit without degrading the frequency stability of any selected frequency.

It is still another object of this invention to provide a switchable crystal oscillator which has a high-frequency stability at any selected signal frequency, a high switching rate for switching from one to another frequency and which provides an output signal entirely and completely devoid of signal frequencies of the nonselected frequencies.

It is also an object of this invention to provide a signal source which may be pulse modulated with rise and fall times less than 50 microseconds, which may be switched between preselected frequencies in less than 50 microseconds to full signal strength, which provides signals having very great frequency stability, and in which the output signal includes only the selected frequency.

The above objects of this invention are achieved by providing an oscillator having a plurality of crystals, resonant at the predetermined frequencies, suitably connected in parallel in its feedback circuit. Each crystal is connected into the feedback circuit through a pair of oppositely poled diodes and has associated with it a biasing circuit which normally maintains the diodes back biased. Signal selector circuit means are provided to control the biasing circuits to forward bias the diodes associated with the selected crystal.

The amplifier utilized in the oscillator of this invention is constructed to have a very high forward gain for small signal conditions and includes gain control means to reduce the gain with increase of the signal. The gain control means operates by rectifying the signal and changing the bias of one or more amplifier stages until the desired forward gain of unity is obtained.

Each time a new frequency is desired, the amplifier is momentarily switched off to revert to its small signal condition when a new crystal is switched into the feedback circuit. Likewise, modulation (pulse) turns off the amplifier momentarily thereby restoring the small signal condition.

Other objects and a better understanding of the invention may be had by reference to the following description, taken in conjunction with the accompanying drawing which is a schematic circuit diagram of the switchable crystal oscillator of this invention.

Referring now to the drawing, there is shown a four-stage transistor amplifier, generally indicated by reference numeral 10, having an input amplifier terminal 12 and an output amplifier terminal 14. Connected between terminals 12 and 14 is a feedback network generally indicated by reference numeral 16.

Feedback network 16 comprises an input lead 18, an output lead 20 and a plurality of feedback branches **22*a*, 22*b*,...22*r* connected in parallel between leads 18 and 20. Each feedback branch includes a piezoelectric crystal of a different resonance frequency as indicated by reference numerals 24*a*, 24*b*,...24*r*** The crystals are selected to provide each desired oscillator output signal frequency, there being a crystal for each such output frequency.

Since the feedback branches are identical except for the crystal, the same reference numerals are assigned to various other components in each branch. Each crystal is connected between leads 18 and 20 through a pair of oppositely poled diodes 26 and 28 which are normally maintained back biased except for the crystal which is selected to be in the feedback path. To control the bias of diodes 26 and 28, a biasing network **30*a*, 30*b*, or 30*r* is associated with each feedback branch 22*a*, 22*b*,...22*r*** respectively.

Each biasing network comprises a four-branch resistive bridge including resistive impedances 32, 34, 36 and 38. The junctions between resistors 32, 38 and resistors 34, 36 are respectively connected between a crystal and diode 26, and between that crystal and diode 28, respectively. The junction between resistors 32 and 34 are maintained at a selected potential, say 12 volts, by connection to a source 40. The junction between resistors 36 and 38 is connected to a switching signal input terminal, such as terminal **42*a* for crystal 24*a*, which is normally grounded and to which a switching signal is applied, of say −6 volts, to forward bias diodes 26 and 28**.

For example, resistors 32 and 34 may each be 6.8 kilohms and resistors 36 and 38 may each be 1.3 kilohms. Since the direct current potential on leads 18 and 20 is generally near or just below ground potential, the application of a positive potential of 12 volts to selector terminal 40 and a ground potential to terminal **42*a* will result in a direct current potential of about 2 volts on either side of the crystal maintaining diodes 26 and 28 below cutoff. If now the potential applied to terminal 42*a* is lowered to, say, − 6 volts, the direct current potential on either side of the crystal is sufficiently negative to forward bias diodes 26 and 28 and thereby conductively connect crystal 24*a*** into the feedback circuit.

Referring now to the combination of amplifier 10 and feedback network 16 (assuming one of the crystals is conductively connected between leads 18 and 20) there is provided a crystal-controlled oscillator. To change the crystal in the feedback path from, say crystal 24*a* to crystal 24*b*, the potential applied to terminal 42*a* is changed from one which forward biases to one which back biases associated diodes 26 and 28. A short instant of time later the potential applied to terminal 42*b* is changed from one which back biases to one which forward biases diodes 26 and 28 of network 30*b*. In this manner the oscillator frequency is changed from the resonant frequency of crystal 24*a* to that of crystal 24*b*.

Generally speaking, switching is accomplished by application of a selector signal which, by way of example, may be provided by a selector signal source 44 having a lead connected to each input terminal 42*a*, 42*b*,...42*r*. Selector signal source 44 may be a programmer which maintains all selector terminals, except the selected one, at a potential which back biases associated diodes 26 and 28, and which changes the application of a selector signal to the various selector terminals in some predetermined manner. For consecutively connecting the various crystals into the feedback circuit a ring counter may be utilized. For other and more complicated sequences computer programming may be employed.

Referring now to amplifier 10, it has input and output stages 50 and 52 which are connected for operation as a common base amplifier stage and a common collector amplifier stage, respectively. The term input and output stage as used herein refers to the input and output of the feedback circuit. The two intermediate stages 54 and 56 are connected to operate as common emitter amplifier stages. More particularly, the four stages 50, 54, 56 and 52 comprise NPN junction transistors 60, 61, 62 and 63 having their collectors connected to a positive direct current supply 58 and their emitters to a negative direct current supply 59. The individual stages are coupled through capacitive impedances 64, 65 and 66, connected respectively between the collector of the preceding stage and the base of the following stage. The oscillator output signal is conveniently obtained by connecting oscillator output lead 68 to the collector of third stage 56 so that feedback circuit is isolated from load variations by the fourth stage 52.

Amplifier 10 is a high-gain amplifier, having a small-signal amplification in excess of 100 unlike those used in ordinary crystal oscillators. Since the overall gain of an amplifier, used as an oscillator, must drop to unity when oscillations are steady, one or more stages of amplifier 10 are provided with rectification means by which the stage amplification is reduced through self-biasing. To this end a capacitive impedance 70 is connected between ground and the emitter of transistor 61 in parallel with biasing resistor 71. Likewise, a capacitive impedance 72 is connected between ground and the emitter of transistor 62 in parallel with biasing resistor 73.

Amplifier 10 is also provided with means to turn the same on and off, or to pulse modulate the output signal in some desired manner by means of a modulating or enabling signal from an enabling signal source 74. The enabling signal impressed upon a lead 75 is applied, through resistor 76 to the base of transistor 61 and through resistor 77 to the base of transistor 62. The enabling signal increases the biasing potential of the emitter to a point above cutoff for transistors 61 and 62, say from −6 volts to zero volts or higher.

The operation of the switchable crystal oscillator of this invention will now be explained. In the absence of an enabling signal from source 74, amplifier 10 has one or more stages which are maintained below cutoff so that there is no output signal. Even though the drawing only shows two transistor stages controlled by the enabling signal, which maintains the same normally below cutoff, one or more of the remaining stages may likewise also be controlled by source 74 either in addition to or instead of the intermediate stages. As a practical matter, a majority of the stages usually have their base bias controlled in the manner heretofore described.

Assume next that a suitable selector signal has been generated by source 44 which switched a selected crystal conductively into the feedback circuit 16. Upon the generation of an enabling signal the bias of the emitters of the controlled transistors is raised above cutoff and very small oscillations start. Since for small signal conditions amplifier 10 operates as a class A high-gain amplifier the turn-on time of the oscillator is very small, even though the time constant of the crystal is large. In other words, practically instantaneously full amplitude of the output signal on lead 68 is obtained.

As the signal being amplified increases in amplitude, emitter-base junctions of transistors 61 and 62 begin to operate as rectifiers and to charge up capacitors 70 and 72 thereby raising the potential of the emitters of transistors 61 and 62 in a positive sense. The capacitance of capacitors 70 and 72 is selected such that a positive charge is retained during the negative going portion of the signal being amplified. In other words, the time constant of the circuit comprising capacitor 70 and resistor 71 (and capacitor 72 and resistor 73) is selected sufficiently large so that capacitor discharge is slower than the negative going portion of the signal being amplified, but not so large as to hold the charge at substantially full value during the time of one cycle of the signal being amplified. It has been found that a time constant in the range from approximately 120 percent to 170 percent of inverse of the angular frequency ($1/2\pi f$) of the midfrequency of the various signal frequencies is admirably suitable. This reduces the gain of stages 54 and 56 until these stages operate as class C amplifiers and the overall amplification of amplifier 10 approaches unity. Even though the self-biasing circuit is being shown associated only with the two center stages, the other stages may be provided by such a self-biasing circuit means in addition to, or instead of, the center stages.

The same considerations prevail when pulse modulating the output signal on lead 68 by means of a pulsed enabling signal. Each time the amplitude of the enabling signal is made negative to cutoff the controlled stages, the output signal has a very short fall time which depends primarily on the sharpness of the cutoff edge of the enabling pulse and which substantially is independent of the time constant of the crystal. Likewise, when the leading edge of the enabling pulse is applied to the emitters of transistors 61 and 62, amplifier 10 commences as a high-gain amplifier for the small signal condition until self-biasing through rectification suitably reduces the gain to unity. It has been found that rise and fall times of 2 to 10 microseconds can be obtained with this arrangement.

From the forgoing description it is clear that amplifier 10 is actually a variable-gain amplifier whose amplification is a function of the amplitude of the input signal (from the feedback path). Accordingly, this invention may be practiced by utilizing an amplifier with automatic gain control, the requirement being that its gain be large for the small-signal condition and that the gain reduces to unity for the large-signal condition.

The switching operation by which the frequency of the output signal is switched from one to another frequency is likewise very fast, and switching rates below 15 microseconds can be readily achieved. When switching from one to another frequency the following considerations apply. As long as the selector signal disconnects the previously selected crystal out of the feedback circuit prior to connecting the next selected crystal into the feedback circuit, all oscillations cease momentarily and capacitors 70 and 72 discharge to restore amplifier 10 to class A operation. As soon as the next selected crystal is connected into the feedback circuit, oscillations immediately start and since the amplifier is operative in its high-gain mode, a full amplitude output signal is obtained very rapidly even though the crystal time constant is much longer.

Utilization of a ring counter, for example, provides a selection signal which goes to its "zero" condition on one terminal before it goes to its "one" condition on the next terminal in the counting sequence. A ring counter is therefore ideally suited for providing a cycle selector signal source.

Because crystals often have more than one resonant frequency it has been found convenient to broadly tune amplifier 10 to the range of frequencies desired. To this end, amplifier stages 50 and 56 are provided with tunable parallel resonance circuits 80 and 82 respectively. These circuits may be connected in the collector circuit so that oscillator signals outside the broad frequency band of interest are effectively suppressed.

There has been described a switchable oscillator providing a signal having a frequency stability characteristic of those of crystal oscillators and having a switching time which is smaller, by an order of magnitude of more than 100, than that of conventional crystal oscillators. Further, the switchable oscillator has an output from which any trace of an unselected frequency is absent.

What is claimed is:

1. A switchable and modulatory crystal oscillator comprising:

a transistor amplifier having a small signal gain in excess of 100 and including feedback path input and output terminals;

a plurality of feedback paths connected in parallel between said input and output terminals, each feedback path including a piezoelectric crystal;

diode means connected to each of said crystals;

a biasing circuit connected to each of said diode means to normally back bias said diode means, each said biasing circuit being responsive to a selector signal and operative to forward bias the associated one of said diode means upon occurrence of said selector signal to conductively connect one of said crystals into said feedback path;

enabling means connected to at least the base electrode of at least one transistor forming a stage of said amplifier and normally maintaining said stage below cutoff, said enabling means generating an enabling signal to operationally bias said stage into conduction;

gain control means associated with each stage of said transistor amplifier to which said enabling means is connected, said gain control means being operative to provide maximum gain in said amplifier upon occurrence of said enabling signal, when oscillations of said crystal are at a minimum value, and to decrease the amplifier gain thereafter as the amplitude of said crystal oscillation increases; and selector means for supplying said selector signals to switch different ones of said crystals, one at a time, into said feedback path.

2. Apparatus in accordance with claim 1 in which said biasing circuit comprises a four-branch resistive bridge network with said crystal being connected across one pair of diagonal terminals of said network, and in which said diode means comprises a pair of oppositely poled diodes each connected to one of said last-mentioned pair of diagonal terminals, said selector means and a source of bias potential being respectively connected to the other pair of diagonal terminals of said network.

3. Apparatus in accordance with claim 1 in which said selector means is operable to first switch the connected one of said crystals out of said feedback path and then to switch another of said crystals into said feedback path.

4. Apparatus in accordance with claim 1 in which said enabling means includes modulating means for providing said enabling signal to modulate said oscillator in accordance with a preselected modulating program.

5. Apparatus in accordance with claim 1 in which said gain control means includes a self-biasing circuit comprising a capacitive impedance connected between the emitter electrode of one of said transistor and ground, said capacitive impedance increasing its charge as the amplitude of said crystal oscillations increases to decrease the gain of said amplifier.

6. Apparatus for pulse modulating a crystal oscillator comprising:

a transistor amplifier;

a plurality of parallel feedback paths connected to said amplifier, each said feedback path including a crystal having a different resonant frequency;

switch means associated with each of said feedback paths, each said switch means normally open to disconnect each of said feedback paths from said amplifier;

means for applying a pulse-modulating signal to at least the base electrode of one transistor forming one stage of said amplifier to render it conductive;

gain control means connected to the stage of said amplifier to which said pulse-modulating signal is applied for providing maximum gain in said amplifier when said amplifier is first rendered conductive and for decreasing this gain thereafter; and means for applying successive switching signals to said switch means, one at a time, to thereby connect different ones of said feedback paths to said amplifier, whereby an output signal of the frequency of the crystal associated with the connected feedback path is generated.